US010083861B2

(12) United States Patent
Bu et al.

(10) Patent No.: US 10,083,861 B2
(45) Date of Patent: *Sep. 25, 2018

(54) HDP FILL WITH REDUCED VOID FORMATION AND SPACER DAMAGE

(71) Applicants: INTERNATIONAL BUSINESS MACHINES CORPORATION, Armonk, NY (US); GLOBALFOUNDRIES Inc., Grand Cayman (KY)

(72) Inventors: Huiming Bu, Millwood, NY (US); Andrew M. Greene, Albany, NY (US); Balasubramanian Pranatharthiharan, Watervliet, NY (US); Ruilong Xie, Niskayuna, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/625,360

(22) Filed: Jun. 16, 2017

(65) Prior Publication Data

US 2017/0287776 A1  Oct. 5, 2017

Related U.S. Application Data

(60) Continuation of application No. 15/426,573, filed on Feb. 7, 2017, now Pat. No. 9,935,003, which is a
(Continued)

(51) Int. Cl.
*H01L 21/768* (2006.01)
*H01L 29/66* (2006.01)
(Continued)

(52) U.S. Cl.
CPC .... *H01L 21/76837* (2013.01); *H01L 21/0217* (2013.01); *H01L 21/02167* (2013.01);
(Continued)

(58) Field of Classification Search
CPC ......... H01L 21/76837; H01L 21/76802; H01L 21/0217; H01L 21/823437;
(Continued)

(56) References Cited

U.S. PATENT DOCUMENTS 6,255,162 B1  7/2001  Tsai et al.
6,593,615 B1  7/2003  Shu et al.
(Continued)

OTHER PUBLICATIONS

List of IBM Patents or Patent Applications Treated as Related dated Jun. 16, 2017, 2 pages.
(Continued)

*Primary Examiner* — Fernando L Toledo
*Assistant Examiner* — Adam S Bowen
(74) *Attorney, Agent, or Firm* — Tutunjian & Bitetto, P.C.; Vazken Alexanian

(57) ABSTRACT

A method for filling gaps between structures includes forming a plurality of high aspect ratio structures adjacent to one another with gaps, forming a first dielectric layer on tops of the structures and conformally depositing a spacer dielectric layer over the structures. The spacer dielectric layer is removed from horizontal surfaces and a protection layer is conformally deposited over the structures. The gaps are filled with a flowable dielectric, which is recessed to a height along sidewalls of the structures by a selective etch process such that the protection layer protects the spacer dielectric layer on sidewalls of the structures. The first dielectric layer and the spacer dielectric layer are exposed above the height using a higher etch resistance than the protection layer to maintain dimensions of the spacer layer dielectric through
(Continued)

the etching processes. The gaps are filled by a high density plasma fill.

20 Claims, 10 Drawing Sheets

Related U.S. Application Data continuation of application No. 15/092,272, filed on Apr. 6, 2016, now Pat. No. 9,721,834, which is a division of application No. 14/750,741, filed on Jun. 25, 2015, now Pat. No. 9,558,995.

(51) Int. Cl.
*H01L 21/8234* (2006.01)
*H01L 21/02* (2006.01)
*H01L 27/088* (2006.01)
*H01L 21/311* (2006.01)

(52) U.S. Cl.
CPC .. *H01L 21/31111* (2013.01); *H01L 21/76802* (2013.01); *H01L 21/823418* (2013.01); *H01L 21/823437* (2013.01); *H01L 21/823475* (2013.01); *H01L 27/088* (2013.01); *H01L 29/6653* (2013.01); *H01L 29/66545* (2013.01); *H01L 29/66553* (2013.01)

(58) Field of Classification Search
CPC ....... H01L 21/31111; H01L 21/823475; H01L 27/088; H01L 29/6653
USPC ........................................................ 257/368
See application file for complete search history.

(56) References Cited

U.S. PATENT DOCUMENTS

| | | |
|---|---|---|
| 7,713,887 B2 | 5/2010 | Eun |
| 7,799,630 B2 | 9/2010 | Yu et al. |
| 8,093,146 B2 | 1/2012 | Wang |
| 8,143,159 B2 | 3/2012 | King et al. |
| 8,673,725 B2 | 3/2014 | O'Meara et al. |
| 8,846,532 B2* | 9/2014 | Feng .................. H01L 21/6836 216/88 |
| 8,916,950 B2 | 12/2014 | Kim et al. |
| 9,735,154 B2 | 8/2017 | Wei et al. |
| 2007/0269958 A1* | 11/2007 | Li ..................... H01L 21/76224 438/424 |
| 2013/0309856 A1 | 11/2013 | Jagannathan et al. |
| 2014/0073142 A1* | 3/2014 | Hirose .................. C23C 16/30 438/762 |
| 2014/0191333 A1 | 7/2014 | Chang et al. |
| 2014/0217482 A1 | 8/2014 | Xie et al. |

OTHER PUBLICATIONS

Ko, C.H., et al., "A Novel CVD-SiBCN Low-K Spacer Technology for High-Speed Applications," Symposium on VLSI Technology, Jun. 2008. (pp. 108-109).

* cited by examiner

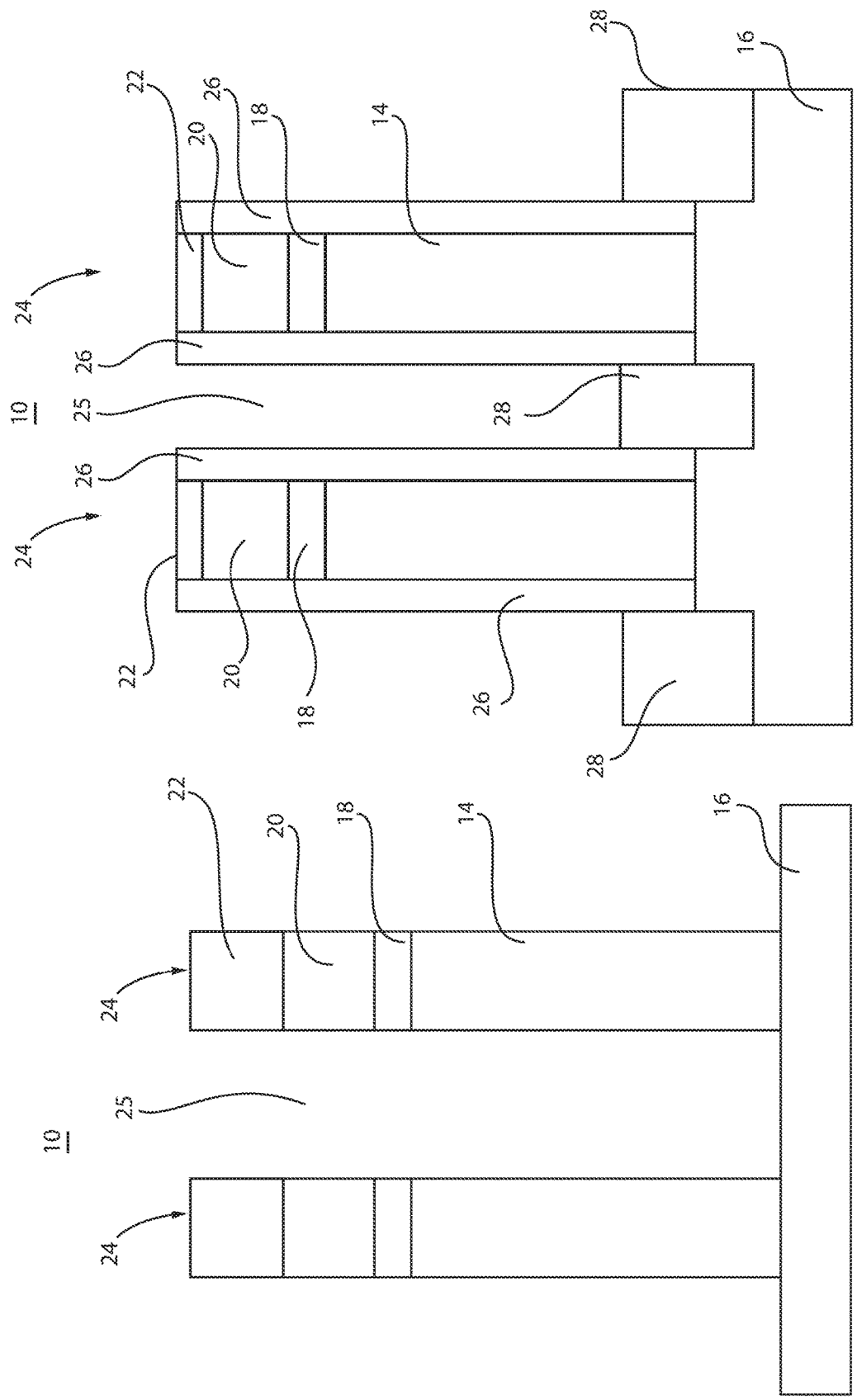

HDP FILL WITH REDUCED VOID FORMATION AND SPACER DAMAGE

BACKGROUND

Technical Field

The present invention relates to semiconductor devices and processing methods, and more particularly to improved dielectric fill processes especially with components with small gaps between them.

Description of the Related Art

Semiconductor devices include a wide range of topographical features. In some devices, high aspect ratio features cause deep and narrow gaps to form between them. The gaps are often filled with a dielectric fill process. The dielectric fill process often fills the gaps from the bottom up. As material is deposited in the bottom of the gap, material begins to form on sidewalls of the features as well. This can cause pinch off and result in voids.

Scaling a pitch of features (e.g., making device sizes smaller) can lead to issues during the fill process and during process steps that recess the fill material to expose more of the features. In one example, the features may include gate structures with dielectric spacers and hard mask caps. During a fill process or a recess process, voids can form and hard mask or spacer damage can occur. This may result in issues with these structures later on in the process or with the reliability of the device after manufacture.

SUMMARY

A method for filling gaps between structures in a semiconductor device includes forming a plurality of high aspect ratio structures adjacent to one another to provide gaps therebetween; forming a first dielectric layer on top of the high aspect ratio structures; conformally depositing a spacer dielectric layer over the high aspect ratio structures; removing the spacer dielectric layer from horizontal surfaces; conformally depositing a protection layer over the high aspect ratio structures; filling the gaps with a flowable dielectric; recessing the flowable dielectric to a height along sidewalls of the high aspect ratio structures by a selective etch process such that the protection layer protects the spacer dielectric layer on sidewalls of the high aspect ratio structures; exposing the first dielectric layer and the spacer dielectric layer by an etch process that selectively removes the protection layer above the height wherein the first dielectric layer and the spacer dielectric layer have a higher etch resistance than the protection layer to maintain dimensions of the spacer layer dielectric through the recessing step and the exposing step; and filling the gaps by a high density plasma fill.

Another method for filling gaps between structures in a semiconductor device includes patterning a stack of layers including at least a gate material, a first dielectric layer and a hard mask layer to form a plurality of high aspect ratio structures adjacent to one another to provide gaps therebetween; conformally depositing a spacer dielectric layer over the high aspect ratio structures; removing the spacer dielectric layer from horizontal surfaces to form spacers on sidewalls of the high aspect ratio structures; forming source and drain regions adjacent to the spacers; conformally depositing a protection layer over the high aspect ratio structures and the source and drain regions; filling the gaps with a flowable dielectric; recessing the flowable dielectric to a height along the sidewalls of the high aspect ratio structures by a selective etch process such that the protection layer protects the spacers of the high aspect ratio structures; exposing the first dielectric layer and the spacers by an etch process that selectively removes the hard mask and the protection layer above the height wherein the first dielectric layer and the spacer dielectric layer have a higher etch resistance than the hard mask and the protection layer to maintain a thickness of the spacers through the recessing step and the exposing step; and filling the gaps by a high density plasma fill.

A semiconductor device includes a plurality of high aspect ratio gate structures formed adjacent to one another and forming gaps therebetween, the high aspect ratio gate structures including a top surface. Spacers are formed on sidewalls of the high aspect ratio gate structures, the spacers having a higher etch resistance than SiN in a selective oxide etch to maintain dimensions of the spacers during etch processes. The gaps are filled with a protection layer formed on the spacers to a height on the spacers, a flowable dielectric formed to below the height within the protection layer and a high density plasma dielectric fill above the height. Contacts are formed through the high density plasma dielectric fill, the flowable dielectric and the protection layer to connect to source and drain regions.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view showing high aspect ratio structures with a thin dielectric layer having a different etch selectivity than a hard mask layer on top of the thin dielectric layer in accordance with the present principles;

FIG. 2 is a cross-sectional view of FIG. 1 showing a sidewall spacer layer formed of a same material as the thin dielectric layer and the formation of epitaxially grown structures adjacent to sidewall spacers on the high aspect ratio structures in accordance with the present principles;

DETAILED DESCRIPTION

Figure 3:
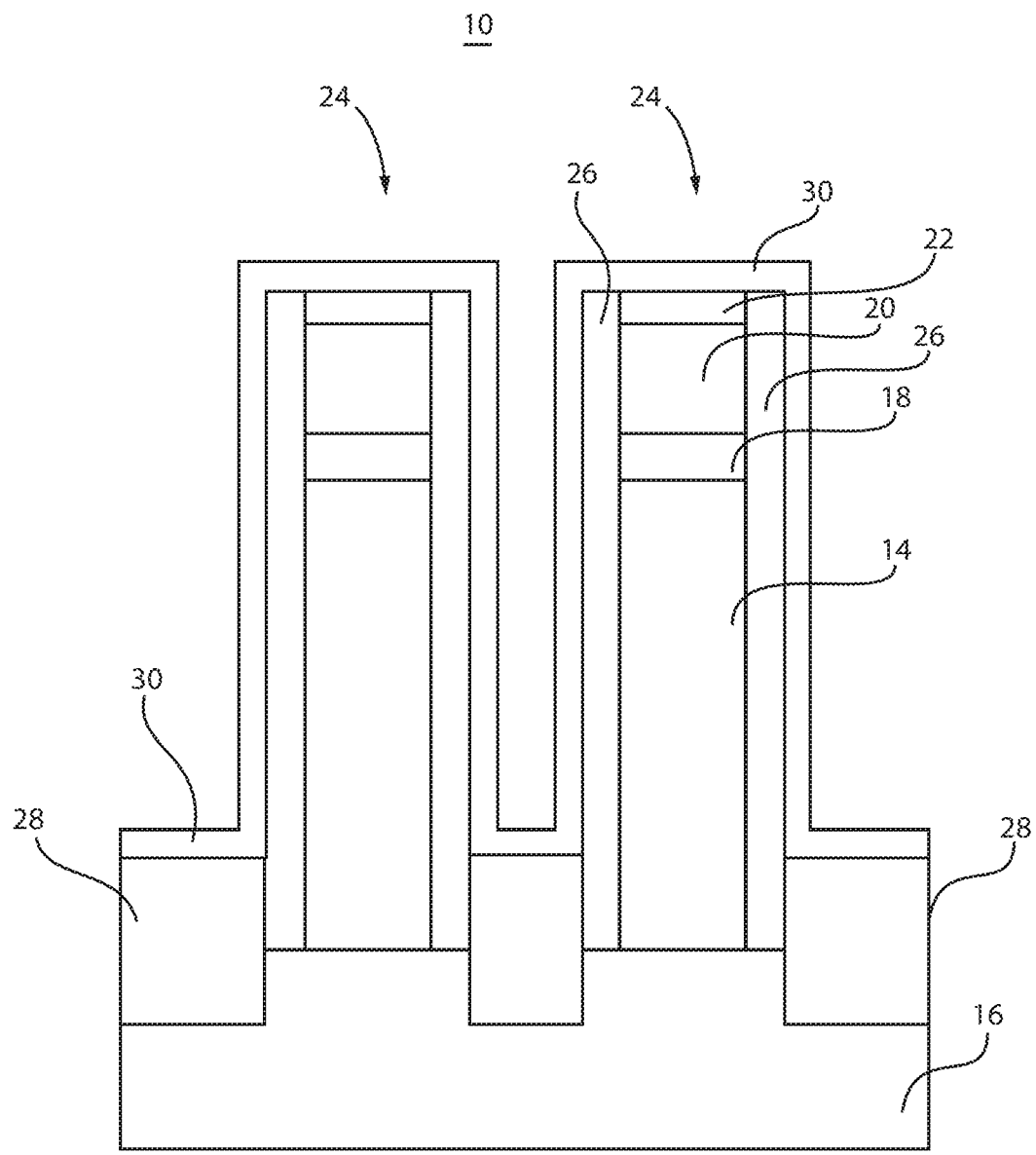
FIG. 3 is a cross-sectional view of FIG. 2 showing a protection layer formed over the high aspect ratio structures in accordance with the present principles.

In accordance with the present principles, device and methods for fabricating devices are provided that reduce the formation of voids and damage to adjacent structures during a gap fill process and/or a gap fill recess process. In one embodiment, a liner etch process is performed selective to spacers on high aspect ratio structures after a flowable dielectric fill and recess process. The liner protects the spacers on high aspect ratio structures during the fill and recess steps but then provides a selective removal to provide valuable "real-estate" when continuing to fill gaps. This process serves to prevent void formation and spacer damage. In one particularly useful embodiment, a semiconductor device includes a plurality of gate structures having spacers formed on sidewalls thereof. The spacers may include, e.g., SiBCN spacers. A SiN liner etch process selective to the SiBCN spacers, after a flowable oxide recess, may be employed to provide a larger gap when continuing to oxide fill to prevent void formation and spacer damage.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view is shown for a partially fabricated semiconductor device 10 in accordance with one embodiment. Device 10 includes substrate 16. The substrate 16 is appropriately doped to form wells for the respective devices or is otherwise processed depending on the devices to be fabricated. The substrate 16 may include a Si substrate, although other materials, may be employed, e.g., SiGe, SiC, etc. A gate layer 14 may include polysilicon as a dummy structure or a conductor as a gate first structure. It should be understood that the present principles may be employed for dummy gate structures; this process includes accommodations later in the processing for replacing the dummy gate with a conductor.

A thin dielectric layer 18 is formed over the gate layer 14, and a cap layer or hard mask layer 20 is formed on the thin dielectric layer 18. In one embodiment, thin dielectric layer 18 includes a nitride, and more particularly, SiBCN. The cap layer 20 may include a nitride as well. The nitride may include SiN and may be formed using a plasma enhanced chemical vapor deposition (PECVD) process. The cap layer 20 should be selectively removable with respect to the thin dielectric layer 18. The thin dielectric layer 18 may include a thickness of between about 5 nm to about 15 nm. A mask dielectric layer 22 may include an oxide, and is formed over the cap layer 20.

The mask dielectric layer 22, the cap layer 20, thin dielectric layer 18 and the gate layer 14 are patterned to form high aspect ratio structures 24 down to the substrate 16 with gaps 25 therebetween. Etch processes, such as reactive ion etch processes, are employed using the mask dielectric layer 22 as a mask, which may be patterned using a lithographic process. The etch chemistries may be altered depending on the material being etched although a single etch chemistry and process may be employed, e.g., an oxygen plasma, etc. It should be understood that the high aspect ratio structures (e.g., height to width ratio of greater than 1:1 and more preferably greater than 3:1) described here are illustrative and that other components or features may be employed in accordance with the present principles.

Referring to FIG. 2, a spacer dielectric 26 is conformally deposited over the device 10. The spacer dielectric 26 preferably includes a same material (same etch characteristics) as the thin dielectric layer 18. The spacer dielectric 26 may include a nitride and, in particular, a SiBCN. A reactive ion etch (RIE) or other process is performed to remove the spacer dielectric 26 from horizontal surfaces. The spacer dielectric 26 may include a thickness, after etching of between about 4 nm to about 8 nm on vertical surfaces, but can exceed, e.g., 10-12 nm. The spacer dielectric 26 thickness depends on spacer quality, dielectric constant, damage during recess and/or high density plasma (HDP) fill, etc. Recess etch removal of the spacer depends on which process is employed, e.g., selective etching may only remove 1-2 nm.

The substrate 16 may be recessed or at least cleaned to prepare the surfaces for the formation of source/drain (S/D) regions 28. S/D regions 28 are epitaxially grown from the substrate 16. An epitaxial growth process is employed to grow a monocrystalline structure for devices such as field effect transistors. The S/D regions 28 may be grown over the substrate 16 and may be formed adjacent to the spacer dielectric 26 on opposite sides of the structures 24. The S/D regions 28 may include the same material as the substrate 16 or may include a material having a similar or same lattice structure as the substrate 16. The S/D regions 28 may be doped in-situ or may be doped by implantation, diffusion or other process after their formation.

Referring to FIG. 3, a protection layer 30 is deposited over the device 10 to protect the structures 24. The protection layer 30 may include a thin layer, e.g., about 3 nm, of SiN or other dielectric material. The protection layer 30 may be scaled up or down in thickness depending on self-aligned contact RIE selectivity, gate pitch and specified contact size. The protection layer 30 protects the structures 24 from future processing as will be described.

Figure 4:
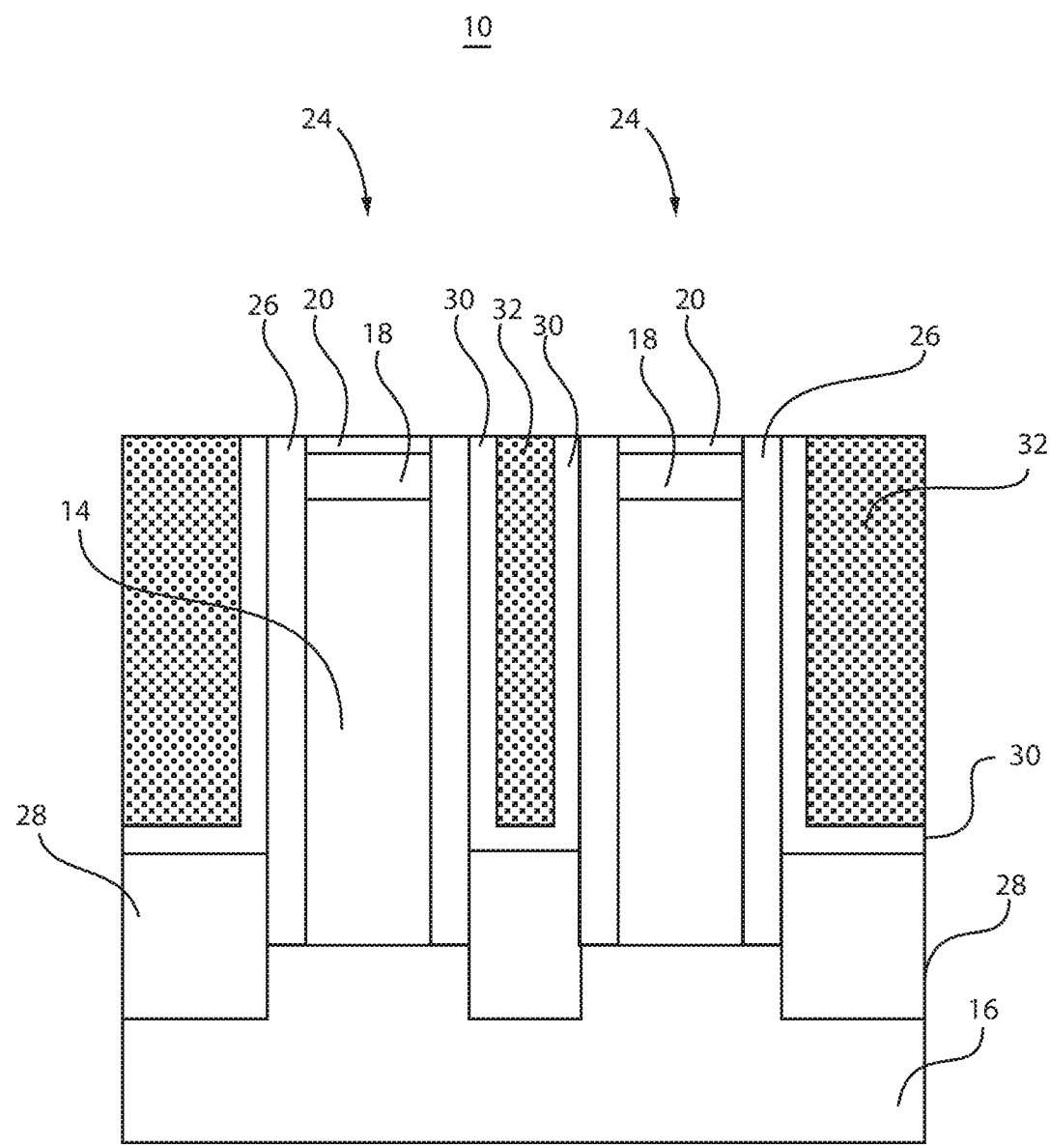
FIG. 4 is a cross-sectional view of FIG. 3 showing a flowable dielectric fill between the high aspect ratio structures in accordance with the present principles.

Referring to FIG. 4, a flowable dielectric 32 is formed over the protection layer 30. The flowable dielectric 32 may include a flowable oxide material. The flowable dielectric 32 fills in gaps between structures 24. The device 10 is then subjected to a planarizing process such as a chemical mechanical polish (CMP). The flowable dielectric 32 will be recessed as will be described.

Figure 5:
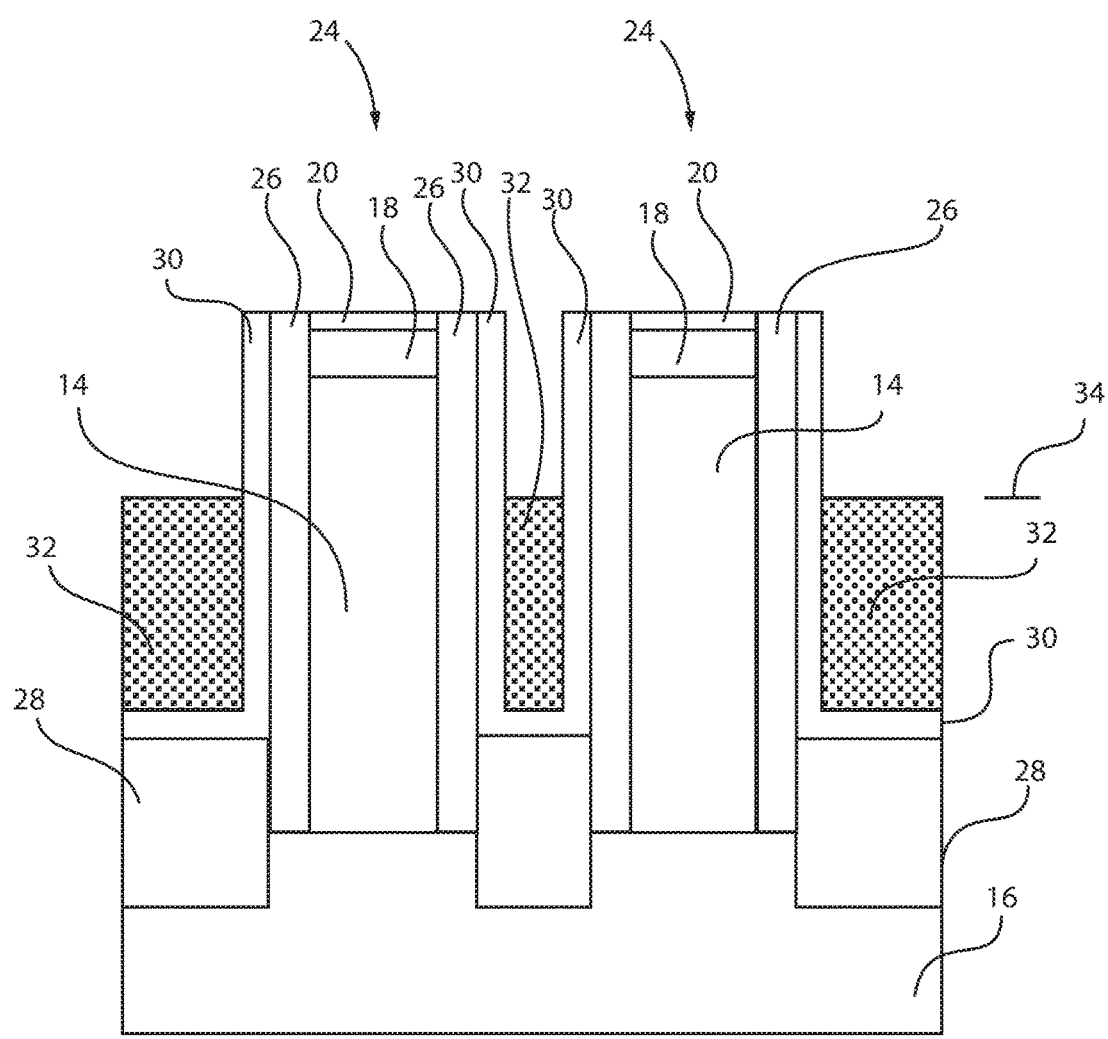
FIG. 5 is a cross-sectional view of FIG. 4 showing the flowable dielectric fill recessed selectively to the protection layer down to a height between the high aspect ratio structures in accordance with the present principles.

Referring to FIG. 5, the flowable dielectric 32 is recessed to a height 34 using an etch process that is highly selective in removing the flowable dielectric relative to the protection layer 30. In one embodiment, the protection layer 30, the spacer dielectric 26 and the cap layer 20 (if present) or the thin dielectric layer 18 (if the cap layer is removed) may all include a form of nitride. Therefore, a highly selective process for the removal oxide against nitride may be provided. Other material combinations may also be employed. During the recess, the protection layer 30 preserves the underlying spacer dielectric 26 so that there is no loss of the spacer dielectric 22 as a result of the recessing process. In conventional process flows, the spacer dielectric begins to be eroded as a result of the recess process.

Figure 6:
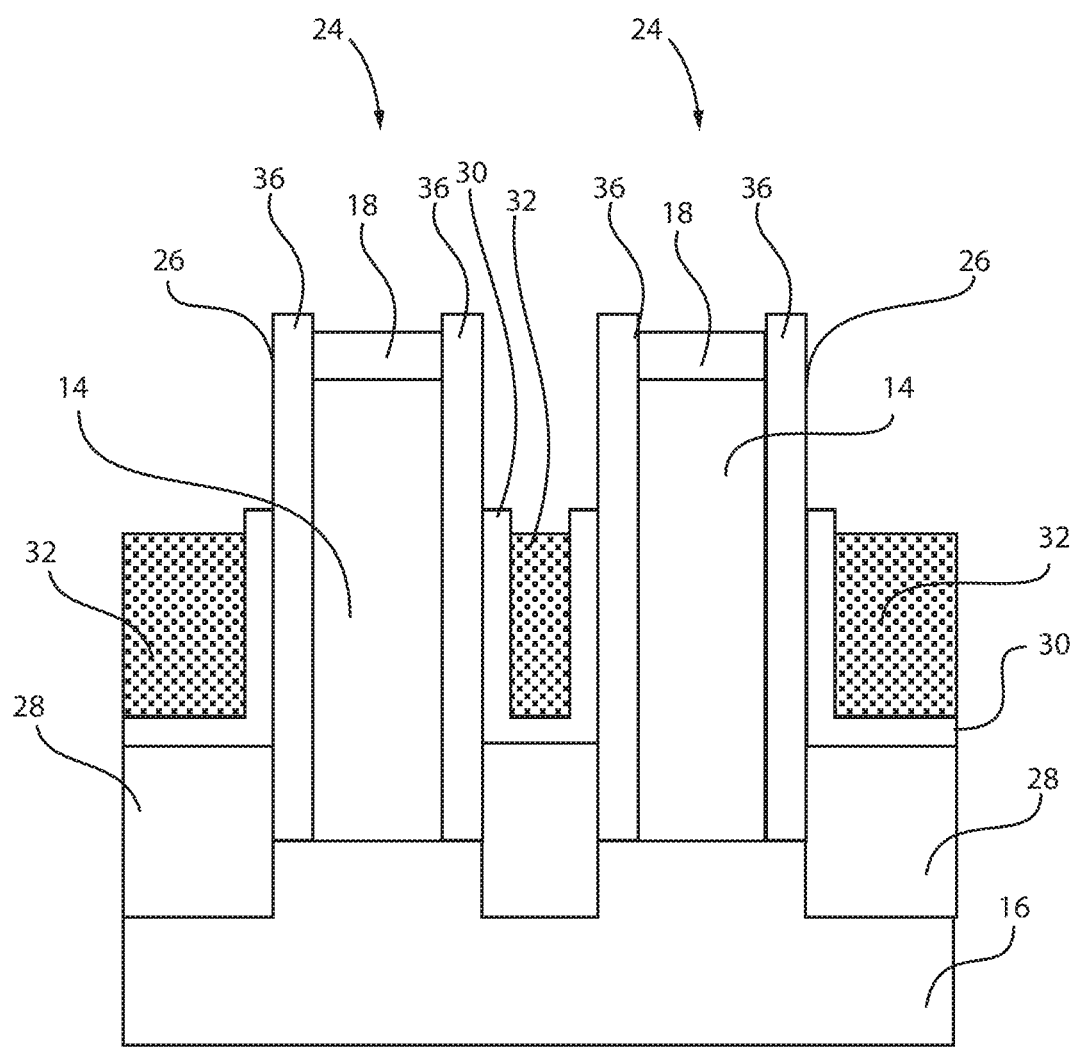
FIG. 6 is a cross-sectional view of FIG. 5 showing a portion of the protection layer and the hard mask layer removed in accordance with the present principles.

Referring to FIG. 6, an etch process is performed to remove the protection layer 30 in exposed areas (e.g., above the height 34). The protection layer 30 is preferably removed selectively to the spacer dielectric 26 and the cap layer 20 (if present is removed relative to the thin dielectric layer 18). In one embodiment, the protection layer 30 and the cap layer include SiN and the thin dielectric layer 18 and the spacer dielectric 26 include SiBCN. In this way, the SiN can be selectively removed relative to the SiBCN. Other material combinations may be employed having the selectivity relationships as described herein.

FIG. 6 shows a fabricated state ready for a high density plasma (HDP) fill. The structure provided in accordance with the present principles, provides horns 36 or additional dielectric material at the top corners of the structures 24. In addition, the spacer dielectric 26 and the thin dielectric layer 18 remains substantially intact through the recess process. Further, using a higher selectivity material for the spacers (26) counteracts etching losses, which permits the use of a thinner spacer dielectric layer 26. This results in additional space for the HDP fill and provides a significant decrease in the formation of voids between the structures 24. The gap size between high aspect ratio structures will, in effect, be increased without altering a pitch between the high aspect ratio structures. In one example, using, e.g., SiBCN permits higher selectivity than SiN. In one embodiment, for a 44 nm node technology, openings 38 for a HDP fill significantly enlarge from, e.g., about 8 nm to about 14 nm (an increase of approximately 75%). The structures 24 remain on pitch but more space is available between them to perform the HDP fill.

In addition, the present principles provide a more controllable process. There is no top profile sharpening or nitride coverage loss from sidewalls of the structure 24. The thin dielectric 18 and the spacer dielectric layer 26 encapsulate and protect the structures 24. When filling the gaps by a high density plasma fill, formation of voids is prevented by providing the gap size that has been increased. The spacer dielectric layer 26 is formed to exceed a height of the thin dielectric layer 18 on sidewalls of the high aspect ratio structures 24 to form horns 36 on top corners of the high aspect ratio structures 24 prior to filling the gaps by the high density plasma fill.

Conventional processes thin the sidewall spacers and especially the top corners on the structures, giving the structures (e.g., gates or dummy gates) the appearance of a picket in cross-section since the dielectric is thinned by etching. The horns 36 and material selection assist in preventing this in accordance with the present embodiments.

Figure 7:
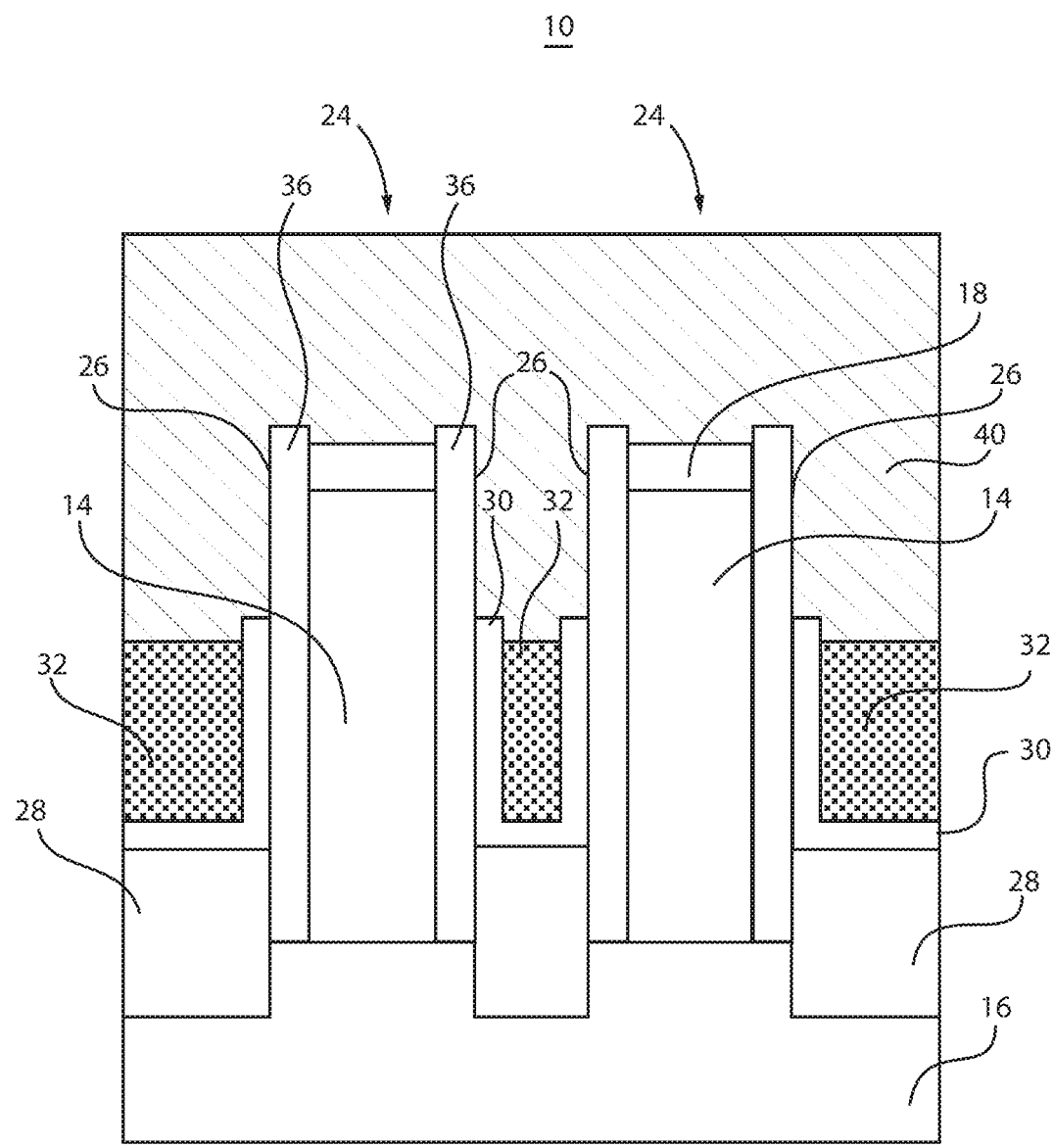
FIG. 7 is a cross-sectional view of FIG. 6 showing an HDP fill in accordance with the present principles.

Referring to FIG. 7, the process can continue with an HDP oxide deposition process to provide an HDP fill and cap 40. The HDP fill 40 has a significantly reduced likelihood of forming voids between structures 24 in accordance with the present principles. A CMP process may be performed to take a top surface of the HDP fill 40 down to layer 18, which acts as an etch stop layer (FIG. 8).

Figure 8:
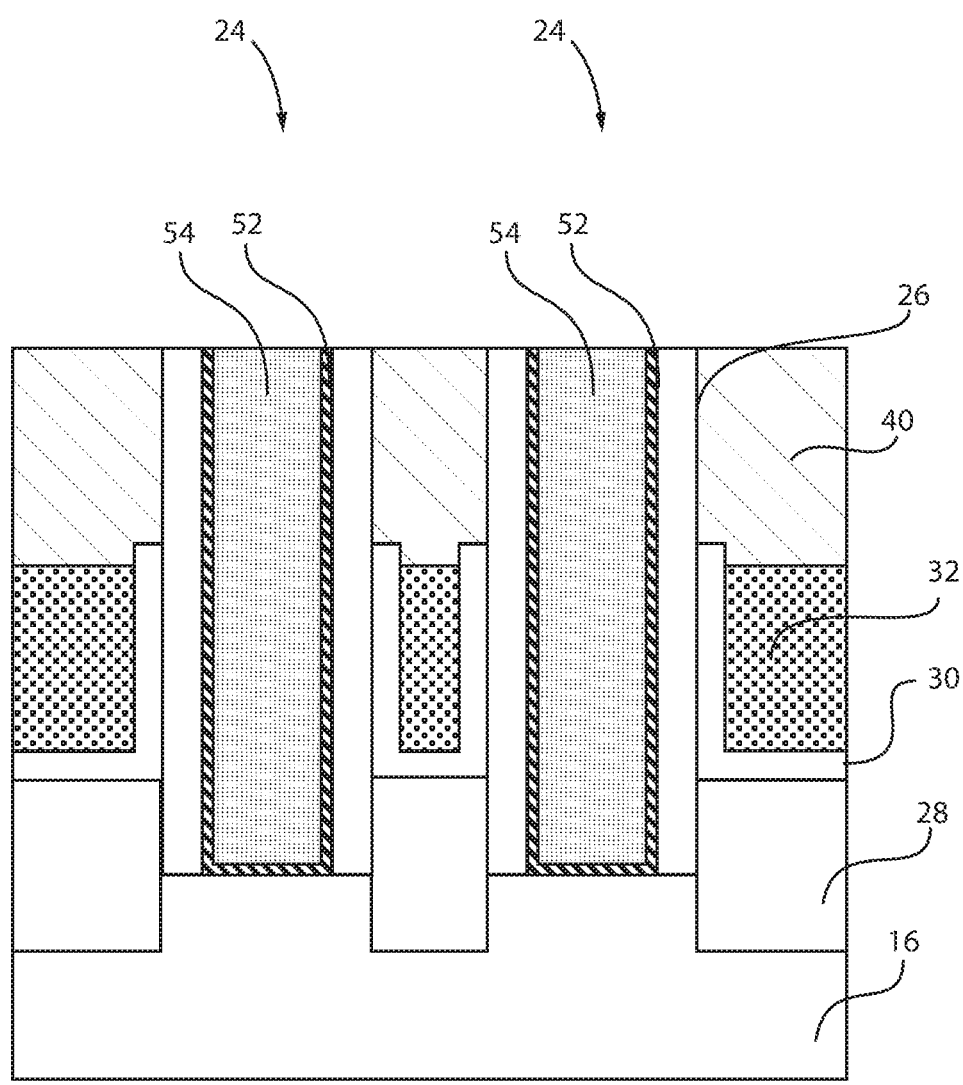
FIG. 8 is a cross-sectional view of FIG. 7 showing the gate structure after a cap reactive ion etch for replacement gate embodiments, a dummy gate is removed, high-k dielectric and gate metal are deposited within a gate region in accordance with the present principles.

Referring of FIG. 8, if a dummy gate structure is employed, layer 18 is removed and dummy gate structures 14 and dummy dielectric (in contact with the substrate 16) are removed. The layer 18 (e.g., SiBCN) and the gate layer 14 may be removed using a RIE. The gate layer 14 may be a dummy gate which can be pulled in a replacement gate process. If the process includes a gate first design, then FIG. 8 can be skipped as an active gate is already formed. A replacement metal gate (RMG) includes the formation of a high-k dielectric (e.g., $HfO_2$) 52 and a work function metal and metal fill (e.g., Tungsten) 54, which are deposited and planarized. The protection layer 30 and the dielectric layer 32 remain throughout the gate replacement process.

Figure 9:
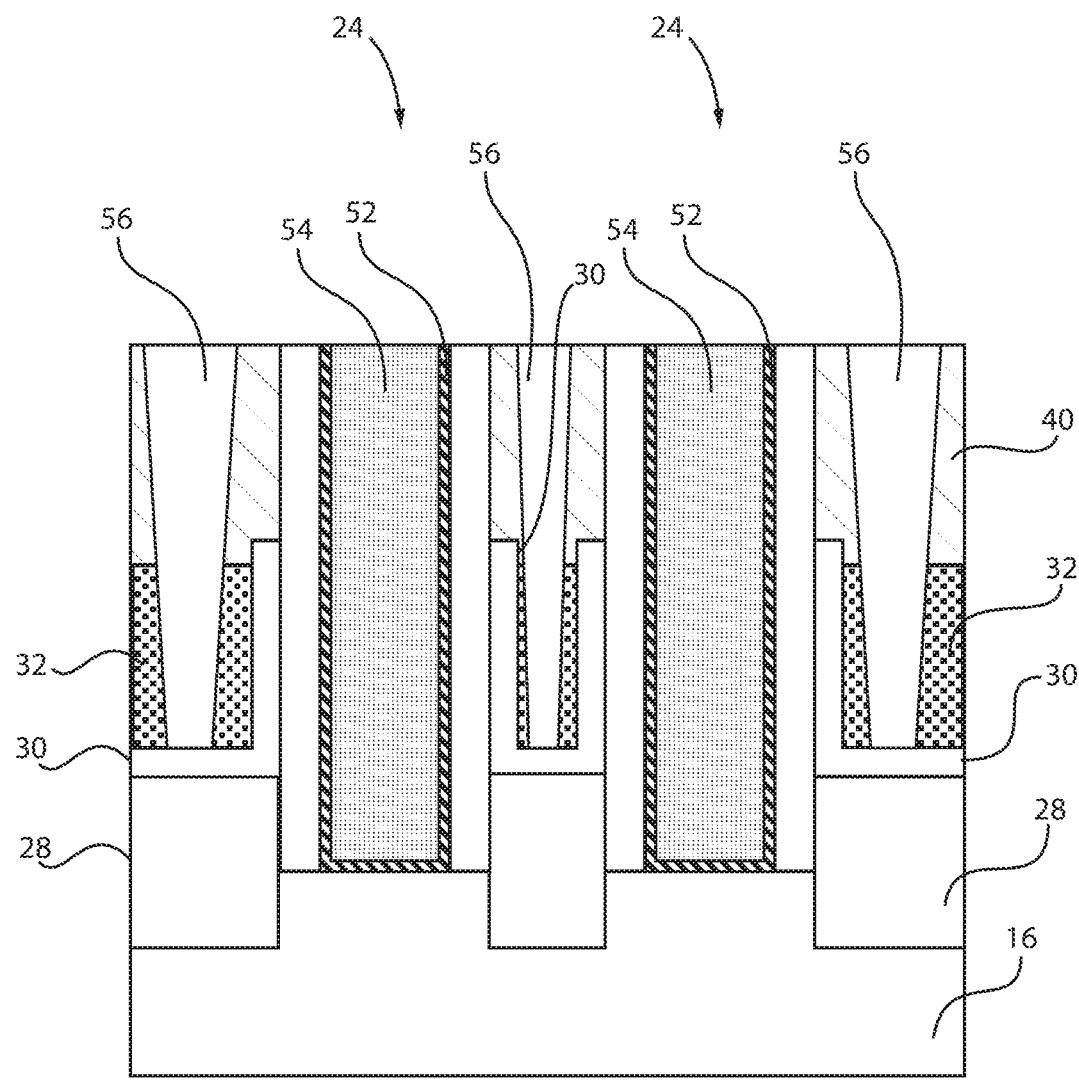
FIG. 9 is a cross-sectional view of FIG. 8 showing contacts holes etched into the interlayer dielectric layers and stopping on the protection layer in accordance with the present principles.

Referring to FIG. 9, contact holes 56 are opened down to the protection layer 30. The contact holes 56 are self-aligned and etched using an RIE process. The RIE stops on protection layer 30 to prevent the epitaxially formed S/D regions 28 from being damaged or etched.

Figure 10:
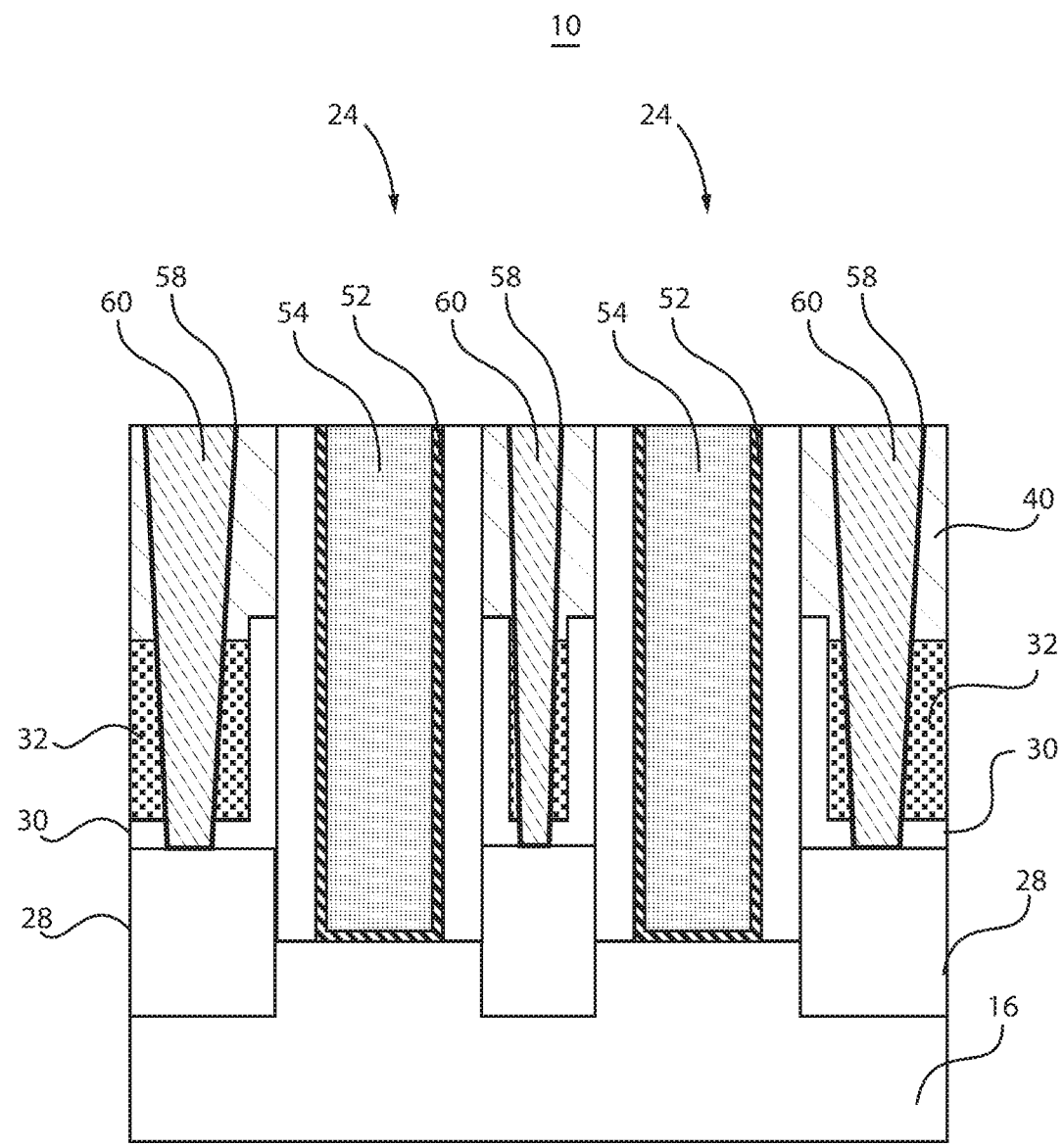
FIG. 10 is a cross-sectional view of FIG. 9 showing removal of the protective liner, deposition of a contact liner and metal contacts formed in accordance with the present principles.

Referring to FIG. 10, the protection layer 30 is selectively etched to expose the surface of the S/D regions 28. The etch chemistry is changed to remove the protection layer in a separate etch process. A self-aligned contact liner 58 is deposited and metallization is deposited to form contacts 60. The contact liner may include TiN, TaN, etc., and the contacts may include W or other metals. Fabrication of the device 10 can continue in accordance with the device design. This may include the formation of metallizations and other structures as are known in the art.

In some embodiments, portions of the protection layer 30 (on the sidewalls adjacent to spacers 26) may remain in place to provide additional protection to the sidewall spacers 26. It should be understood that while the present description illustratively described the structures 24 as gate structures, the present principles should not be construed as being limited by these structures and that any high aspect ratio structures may benefit in accordance with the present principles.

Figure 11:
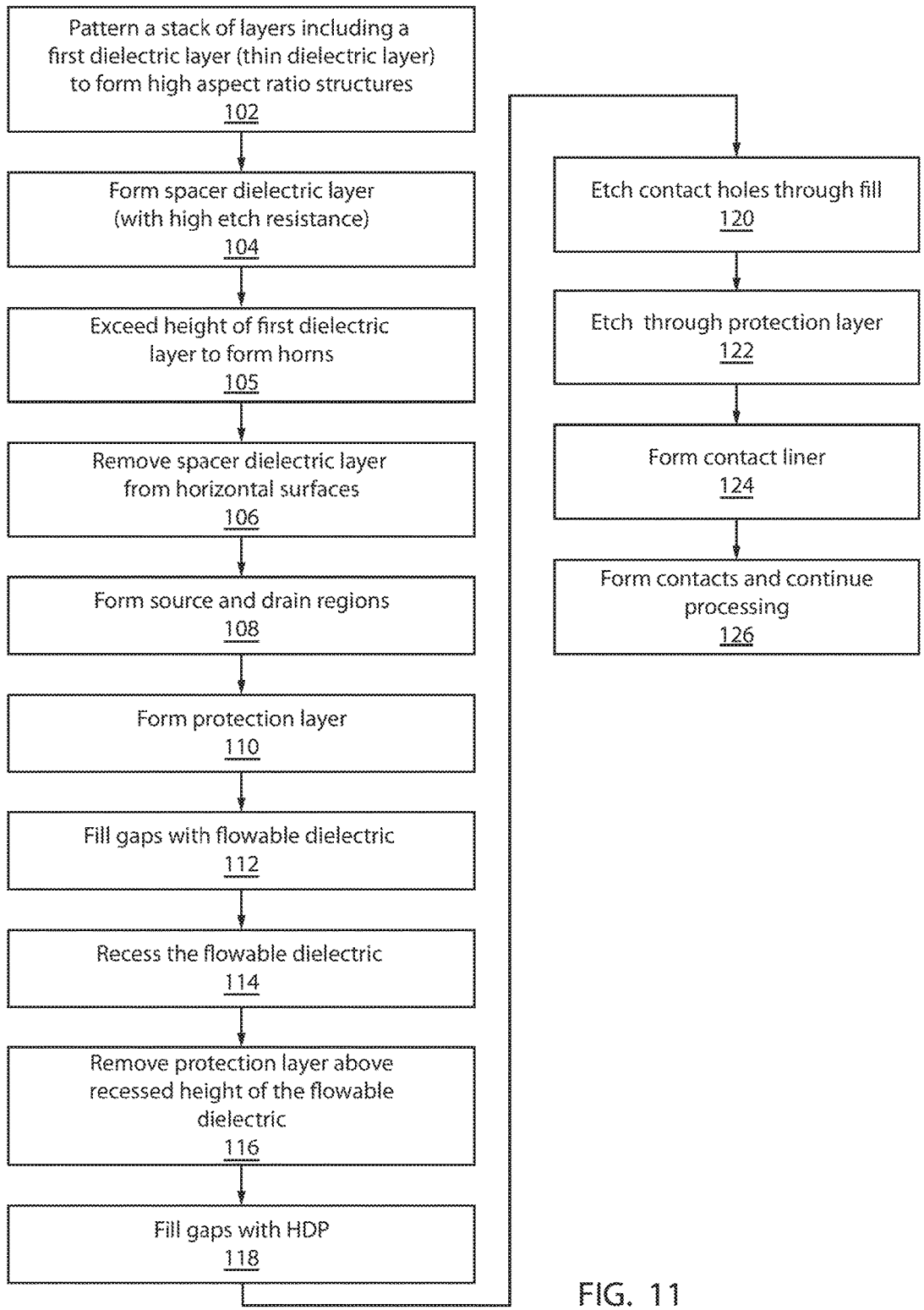
FIG. 11 is a block/flow diagram showing a method for filling gaps between structures in a semiconductor device in accordance with illustrative embodiments.

Referring to FIG. 11, a method for filling gaps between structures in a semiconductor device is illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a stack of layers is patterned to form high aspect ratio structures. The stack may include at least a gate material (e.g., a dummy gate or gate conductor), a first dielectric layer (a thin dielectric layer) and a hard mask layer to form a plurality of high aspect ratio structures adjacent to one another with gaps therebetween. Other layers may also be included to assist in the formation of the high aspect ratio structures. In one embodiment, the first dielectric layer includes a material with a higher etch resistance than SiN, e.g., SiBCN.

In block 104, a spacer dielectric layer is conformally deposited over the high aspect ratio structures. The spacer dielectric layer may include a thickness of about 12 nm or less. Using a thin spacer a gap size between high aspect ratio structures is increased without altering a pitch between the high aspect ratio structures. The spacer dielectric layer may include a material having a higher etch resistance than SiN, e.g., SiBCN.

In block 105, the spacer dielectric layer is deposited over the high aspect ratio structures to exceed a height of the first dielectric layer on sidewalls of the high aspect ratio structures to form horns on top corners of the high aspect ratio structures to protect the structures before and during the filling of the gaps by the high density plasma fill.

In block 106, the spacer dielectric layer is removed from horizontal surfaces to form spacers on sidewalls of the high aspect ratio structures. In block 108, source and drain regions are formed adjacent to the spacers. This step may be optional depending on the devices being formed. In block 110, a protection layer is conformally deposited over the high aspect ratio structures and the source and drain regions, if present. In block 112, the gaps are filled with a flowable dielectric. This may include a CMP process to planarize a top surface. In block 114, the flowable dielectric is recessed to a height along the sidewalls of the high aspect ratio structures by a selective etch process such that the protection layer protects the spacers of the high aspect ratio structures. In block 116, the first dielectric layer and the spacers are exposed by an etch process that selectively removes the hard mask and the protection layer above the height wherein the first dielectric layer and the spacer dielectric layer have a higher etch resistance than the hard mask and the protection layer to maintain a thickness of the spacers through the recessing step (block 114) and the exposing step (block 116).

In block 118, the gaps are filled by a high density plasma fill. This includes avoiding formation of voids by providing an increased gap size using thinner spacers with a higher etch resistance (and bolstered by etch protection throughout the process and a permanent protection layer). The protection layer and the flowable dielectric layer remain between the gate structures and provide protection for the spacers for contact hole etching. In block 120, contact holes are formed through the HDP fill and the flowable dielectric and stop on the protection layer using a self-aligned RIE process. The RIE process selectively removes oxide relative to the gate conductor and spacer materials. The flowable dielectric protects the spacers, and the protection layer protects the underlying source and drain regions. In block 122, the protection layer is then removed in a different etch process to open up and expose the source and drain regions. In block 124, a contact liner is formed. In block 126, contacts are deposited and processing continues.

Having described preferred embodiments for devices and methods for HDP fill with reduced void formation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
   a plurality of high aspect ratio gate structures formed adjacent to one another and forming gaps therebetween, the high aspect ratio gate structures including a top surface;
   spacers formed on sidewalls of the high aspect ratio structures, the spacers having a higher etch resistance than SiN in a selective oxide etch to maintain dimensions of the spacers during etch processes;
the gaps being filled with:
a protection layer formed on the spacers to a height on the spacers;
a flowable dielectric formed to below the height within the protection layer; and
a high density plasma dielectric fill above the height; and
contacts formed through the high density plasma dielectric fill, the flowable dielectric and the protection layer to connect to source and drain regions.

2. The device as recited in claim 1, wherein the spacers include SiBCN.

3. The device as recited in claim 1, wherein the spacers includes a thickness of 12 nm or less to increase a gap size between each of the high aspect ratio gate structures without altering a pitch between each of the high aspect ratio gate structures.

4. The device as recited in claim 3, wherein the gap size between the high aspect ratio structures is free of voids.

5. The device as recited in claim 1, wherein the protection layer includes a nitride.

6. The device as recited in claim 1, wherein the plurality of high aspect ratio structures includes a high to width ratio greater than 1:1.

7. The device as recited in claim 1, wherein the plurality of high aspect ratio structures includes a high to width ratio greater than 3:1.

8. The device as recited in claim 1, wherein each of the plurality of high aspect ratio structures includes at least a gate material and a first dielectric layer.

9. The device as recited in claim 8, wherein the first dielectric layer includes a material having a higher etch resistance than SiN.

10. The device as recited in claim 8, wherein the first dielectric layer includes SiBCN.

11. The device as recited in claim 8, wherein the spacers exceed a height of the gate material and the first dielectric layer such that the spacers form horns on top corners of the spacers.

12. The device as recited in claim 1, wherein the spacers exceed a height of the top surface of the high aspect ratio gate structures such that the spacers form horns on top corners of the spacers.

13. The device as recited in claim 1, wherein the contacts include a contact liner and a metal contact.

14. The device as recited in claim 1, wherein the source and drain regions are disposed on opposite sides of each of the plurality of high aspect ratio gate structures and adjacent to the spacers.

15. A method for filling gaps between structures in a semiconductor device, comprising:
forming a plurality of high aspect ratio structures adjacent to one another to provide gaps therebetween;
forming a spacer dielectric layer over the high aspect ratio structures;
removing the spacer dielectric layer from horizontal surfaces to form spacers on sidewalls of the high aspect ratio structures;
forming source and drain regions adjacent to the spacers;
conformally depositing a protection layer over the high aspect ratio structures and the source and drain regions;
filling the gaps with a flowable dielectric;
recessing the flowable dielectric to a height along the sidewalls of the high aspect ratio structures such that the protection layer protects the spacers of the high aspect ratio structures; and
selectively removing the protection layer above the height to maintain a thickness of the spacers.

16. The method as recited in claim 15, wherein forming the plurality of high aspect ratio structures includes patterning a stack of layers including at least a gate material and a first dielectric layer.

17. The method as recited in claim 15, wherein forming the spacer dielectric layer over the high aspect ratio structures includes conformally depositing the spacer dielectric layer with a thickness of 12 nm or less to increase a gap size between high aspect ratio structures without altering a pitch between the high aspect ratio structures.

18. The method as recited in claim 17, further comprising filling the gaps by a high density plasma fill, wherein filling the gaps by the high density plasma fill includes avoiding formation of voids by providing the gap size that has been increased.

19. The method as recited in claim 15, wherein selectively removing the protection layer includes forming horns on top corners of each of the plurality of high aspect ratio structures.

20. The method as recited in claim 15, further comprising forming contact holes by etching through the flowable dielectric and the protection layer.

* * * * *